(12) United States Patent
Gandhiraman et al.

(10) Patent No.: US 11,773,491 B2
(45) Date of Patent: *Oct. 3, 2023

(54) IN SITU TAILORING OF MATERIAL PROPERTIES IN 3D PRINTED ELECTRONICS

(71) Applicant: Universities Space Research Association, Mountain View, CA (US)

(72) Inventors: Ramprasad Gandhiraman, Sunnyvale, CA (US); Meyya Meyyappan, Pacifica, CA (US); Jessica E. Koehne, Portola Valley, CA (US)

(73) Assignee: UNIVERSITIES SPACE RESEARCH ASSOCIATION, Columbia, MD (US)

( * ) Notice: Subject to any disclaimer, the term of this patent is extended or adjusted under 35 U.S.C. 154(b) by 138 days.

This patent is subject to a terminal disclaimer.

(21) Appl. No.: 17/153,994

(22) Filed: Jan. 21, 2021

(65) Prior Publication Data
US 2021/0254217 A1    Aug. 19, 2021

Related U.S. Application Data

(62) Division of application No. 15/477,700, filed on Apr. 3, 2017, now Pat. No. 10,995,406.
(Continued)

(51) Int. Cl.
*C23C 16/513* (2006.01)
*C23C 16/52* (2006.01)
(Continued)

(52) U.S. Cl.
CPC ............ *C23C 16/513* (2013.01); *B33Y 10/00* (2014.12); *B33Y 30/00* (2014.12);
(Continued)

(58) Field of Classification Search
CPC .................................................. C23C 16/513
See application file for complete search history.

(56) References Cited

U.S. PATENT DOCUMENTS

| 3,179,782 A | * | 4/1965 | Matvay | B05B 7/226 219/76.16 |
| 3,450,926 A | * | 6/1969 | Kiernan | H05H 1/34 219/121.52 |

(Continued)

FOREIGN PATENT DOCUMENTS

JP          04341552 A   *  11/1992

OTHER PUBLICATIONS

Gandhiraman et al, Plasma Jet Printing of Electronic Materials on Flexible and Nonconformal Objects, 2014, ACS Appl. Mater. Interfaces 2014, 6, 23, 20860-20867 (Year: 2014).*

*Primary Examiner* — Timothy Kennedy
(74) *Attorney, Agent, or Firm* — Whiteford, Taylor & Preston, LLP; Peter J. Davis

(57) ABSTRACT

Systems and methods for highly reproducible and focused plasma jet printing and patterning of materials using appropriate ink containing aerosol through nozzles with narrow orifice and tubes with controlled dielectric constant connected to high voltage power supply, in the presence of electric field and plasma, that enables morphological and/or bulk chemical modification and/or surface chemical modification of the material in the aerosol and/or the substrate prior to printing, during printing and post printing.

15 Claims, 11 Drawing Sheets

Related U.S. Application Data

Figure 1A:
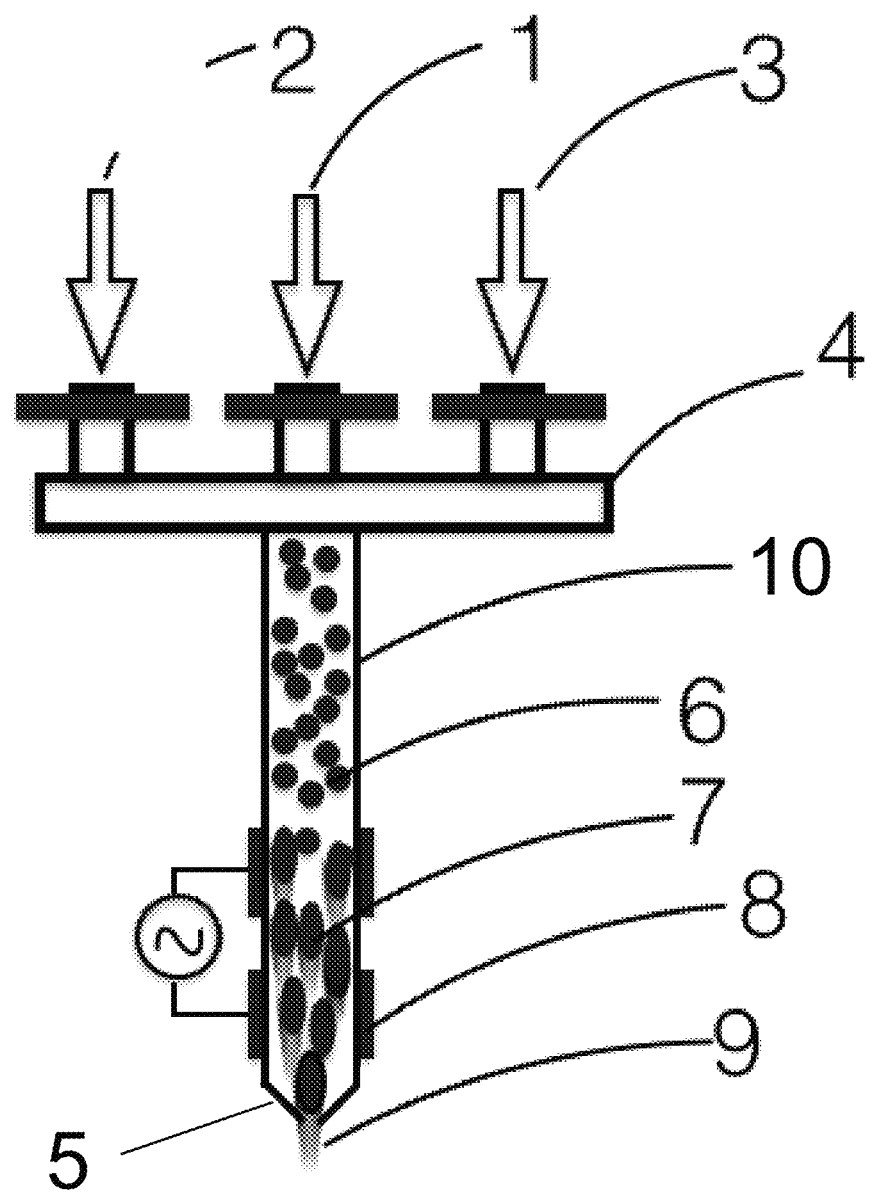

(60) Provisional application No. 62/317,026, filed on Apr. 1, 2016.

(51) Int. Cl.
  B33Y 10/00 (2015.01)
  B33Y 30/00 (2015.01)
  H05H 1/24 (2006.01)
  C23C 16/44 (2006.01)
  H05H 1/42 (2006.01)

(52) U.S. Cl.
  CPC .......... C23C 16/4401 (2013.01); C23C 16/52 (2013.01); H05H 1/2406 (2013.01); H05H 1/42 (2013.01); H05H 1/246 (2021.05)

(56) References Cited

U.S. PATENT DOCUMENTS

| | | | | |
|---|---|---|---|---|
| 3,639,831 A | * | 2/1972 | Cushman | G01N 27/64 324/459 |
| 3,756,511 A | * | 9/1973 | Shinroku | H05H 1/34 239/599 |
| 3,958,883 A | * | 5/1976 | Turner | H05H 1/46 219/121.36 |
| 4,916,273 A | * | 4/1990 | Browning | C23C 4/134 219/76.16 |
| 4,990,740 A | * | 2/1991 | Meyer | H01J 49/044 219/121.48 |
| 5,066,125 A | * | 11/1991 | Rogers | G01N 21/73 356/312 |
| 5,204,144 A | * | 4/1993 | Cann | C23C 16/4584 427/571 |
| 5,477,048 A | * | 12/1995 | Nakagawa | H01J 49/105 250/281 |
| 6,194,036 B1 | * | 2/2001 | Babayan | H05H 1/42 427/580 |
| 6,800,336 B1 | * | 10/2004 | Fornsel | H05H 1/34 427/563 |
| 7,591,957 B2 | * | 9/2009 | Carr | C23C 16/047 219/121.36 |
| 2001/0022295 A1 | * | 9/2001 | Hwang | C23C 16/513 257/E21.279 |
| 2002/0001540 A1 | * | 1/2002 | Nakagawa | G01N 27/626 422/54 |
| 2002/0097295 A1 | * | 7/2002 | Toda | B41J 2/16 347/45 |
| 2003/0087530 A1 | * | 5/2003 | Carr | H01J 37/32376 257/E21.243 |
| 2004/0173316 A1 | * | 9/2004 | Carr | C23C 16/511 156/345.35 |
| 2008/0145553 A1 | * | 6/2008 | Boulos | B05D 3/141 118/620 |
| 2010/0225909 A1 | * | 9/2010 | Feilders | H05H 1/30 356/316 |
| 2013/0115780 A1 | * | 5/2013 | Okumura | H01J 37/32357 438/758 |
| 2013/0146564 A1 | * | 6/2013 | Okumura | C23C 16/505 216/68 |
| 2014/0061165 A1 | * | 3/2014 | Stempfer | B23K 9/08 219/76.16 |
| 2014/0131906 A1 | * | 5/2014 | Hadidi | B29B 9/16 264/15 |
| 2015/0079309 A1 | * | 3/2015 | Krueger | H01J 37/32394 118/723 R |
| 2016/0271874 A1 | * | 9/2016 | Tsai | B29C 64/209 |

\* cited by examiner

US 11,773,491 B2

IN SITU TAILORING OF MATERIAL PROPERTIES IN 3D PRINTED ELECTRONICS

BACKGROUND OF THE INVENTION

Field of the Invention

This invention relates to the field of additive printing.

Description of the Background

There is a growing need for advanced metallization techniques for 3D interconnects in through silicon via (TSV) and 3D integration in integrated circuit (IC) packaging. There is also a demand for printing conductive patterns including printed circuit boards, interconnects, bumps in a range of substrates with varying glass transition temperature and outgassing properties.

Flexible electronics, displays and wearable monitoring technologies require printing of conducting materials including conducting organics and/or metal coatings and interconnects on flexible and non-traditional substrates like plastics, cellulose, polymers, textiles where the conventional techniques for metallization are difficult to apply.

Printing of porous metal structures is critical for catalysis and it is routinely done using deposition on polymeric templates and post processed to remove polymers and to achieve porous structure. These processes are challenging to achieve for high throughput processing. Etching is also performed to create nanoporous surface feature.

Electrochemical deposition and electroless plating are widely used in 3D interconnect deposition. Magnetron sputtering, reactive sputtering, chemical vapor deposition are also used for depositing seed layer in 3D interconnects and through silicon via.

Photolithography, screen printing, laser induced sintering, plasma spray, inkjet printing, aerosol printing, laser sintering are all explored for site selective printing of metals and metal oxides.

State of the art printing technologies for printing conductive pattern, metal and metal oxide coatings are substrate dependent. Different technologies must be adopted for different materials depending on the glass transition temperature, stability in vacuum (outgassing), stability in liquid medium for electroplating etc. Inkjet printing of conductive pattern using copper nanoparticles requires post deposition annealing which limits the use of low glass transition temperature plastics and adds additional processing steps. Screen printing is the most widely used process for planar objects, however the disadvantages include resolution, organic contaminants and the need for post print thermal treatment. Thermal spray and laser induced sintering are widely used industrial techniques in various other contexts. High oxygen concentration, high porosity and difficulty in controlling the microstructure are serious disadvantages of thermal spray process. Thermal spray and laser induced sintering do not provide the capability to tailor the material properties. For electro catalysis applications in electro reduction of $CO_2$ and CO, oxide-derived copper with nano crystalline surface show promising conversion efficiency as compared to metallic copper. Thermal annealing at 500° C. for oxidation of copper and then reduction is performed to achieve the oxide derived nano crystalline copper surface. Different technologies are needed to print the same material with appropriate material and microstructure properties depending on the type of application.

Atmospheric pressure plasma sintering of inkjet printed materials has been reported. It involves a 2 step process (inkjet printing followed by atmospheric plasma sintering), and does not offer tailoring of material properties of the printed materials. Also, the use of inkjet printing in the process severely limits the nature and type of substrates that could be used.

SUMMARY OF THE INVENTION

Controlled deposition of materials with tailored physical, chemical, mechanical and electronic characteristics is needed for advanced manufacturing of electronic devices, components containing conducting materials, magnetic materials, dielectrics, metals and metal alloys as a functional material. In flexible electronics, the substrates vary from low glass transition temperature plastics to paper-like materials which cannot be efficiently used in well-established high vacuum based plasma deposition process. Also, the traditional electrochemical deposition needs a seed metal layer which is normally deposited using vacuum based processes. For 3D printed electronics and flexible electronics, new printing technologies are essential as the conventional processing techniques are highly dependent on the type and nature of substrates. Interconnects in integrated circuits and IC packaging play a crucial role in determining the system performance and speed. In the manufacturing of advanced interconnect for 3D IC packaging, flexible printed circuit boards, vertical integration, through silicon via copper fill and 3D stacking, the printing of copper interconnects with controlled morphology and oxidation state is essential.

Widely used screen printing technologies require pre and post processing for enhanced adhesion and tailoring the chemical state of the materials. Hence, there is a need for advanced printing technology for flexible electronics and 3D printed electronics that can tailor the physical, chemical and electronic properties of the materials being deposited.

In the case of electrocatalysis for $CO_2$ and CO reduction for air treatment and energy conversion, the surface area of catalytic materials is very important. Nanostructured materials with high surface area and porosity have proven to have higher conversion efficiency. There is a need for high throughput printing technology for deposition of porous features for electrocatalysis and also to plasma treatment surfaces to create nanostructures on surfaces.

Deposition of conducting materials including organic electronics, reduced graphene oxide and metallic coating, alloys, magnetic materials, metal oxides and ceramics with tailored surface topography, morphology, porosity, oxidation state and electronic properties are crucial for many applications including interconnects in integrated circuits and packaging, flexible electronics, displays, electrodes in battery, electrocatalysis for air processing and renewable energy applications. For each of these applications, the physical and chemical state of the metal is crucial. For interconnect applications, the morphology plays a key role and the film should be non-porous and smooth. On the other hand, for reduction electrocatalysis application in CO and $CO_2$ conversion, the nanostructured copper surface and porosity can increase the efficiency of the conversion. For flexible electronics and displays, the stiffness and mechanical characteristics of the film is crucial. Depending on the size, shape and nature of the substrate and the application, an appropriate deposition process like electro plating, electroless plating, vacuum deposition, inkjet printing, laser metal sintering is used. However, in all these cases, tailoring the physical and chemical characteristics of the film requires additional post processing including thermal treatment and sometimes require an additional printing process. We have developed a substrate-independent atmospheric pressure plasma jet deposition process with ability to tailor the physical, chemical and mechanical characteristics of the film by in situ process control. The plasma jet deposition technique offers unique capability to deposit conducting materials including organics, reduced graphene oxide, metals, magnetic materials and alloys with tailored physical and chemical characteristics.

Therefore, there is presented according to the invention, systems and methods for focused plasma jet deposition of conducting materials, including organic electronics, reduced graphene oxide, metal layers and/or metal oxide or ceramics, magnetic materials using an aerosol containing the appropriate material which aerosol is delivered through nozzles connected to high voltage power supply, in the presence of electric field and plasma, that enables morphological and/or chemical modification of the metal in the aerosol prior to deposition, during deposition and post deposition.

The nozzle that sustains the plasma and through which the metal-containing aerosol is fed is connected to high voltage power supply through one or more electrodes. The nozzle can be made of any or all of the following silicon wafer, quartz, glass, ceramic, plastic, machinable ceramic, glass reinforced epoxy, polyimide, polyetheretherketone, fluoropolymer, aluminum, silicon wafer containing layers of silicon oxide and metals layers embedded on it.

The diameter of the nozzle used for deposition varies from 10 nm to 50 mm. The diameter determines throughput, deposition rate, pattern size etc.

The electrodes connected to the nozzle to create the plasma can either be externally bound or patterned and deposited to be part of the nozzle by using silicon micro machining and micro electromechanical systems processing depending on the diameter requirement of the nozzle and the resolution of the metal deposition needed.

In the case of silicon micro machined nozzle, the nozzle on the silicon substrate can either be formed using any of the known silicon processing steps like wet etching, dry etching, deep reactive ion etching.

The nozzle can be connected to a range of reactive and or non-reactive gases depending on the requirements.

The material in the aerosol upon entering the region in the nozzle containing plasma is subjected to a combined electrical field, magnetic field, electro hydrodynamic force in addition to thermal and chemical effects due to excitation, de-excitation and collisions in the plasma.

The morphological state, chemical structure, oxidation state, electronic structure and magnetic state of the material can be tailored in one or more of the following states i) in the aerosol prior to deposition, ii) on the substrate during deposition iii) on the substrate post deposition.

The aforementioned metal layer can be deposited on semiconductor wafers including silicon substrates to form metal interconnects, bumps, integrated circuits, metal fill for through silicon via (TSV), contact pads and conducting layers for integrated circuit fabrication.

The metal layer can be deposited on a range of substrates including ceramics, plastics, semiconductors, metals owing to the metal layers characteristics including electrical conductivity, thermal conductivity, thermal cooling, etc.

Accordingly, there is provided according to an embodiment of the invention a plasma jet printer for the in situ tailoring of material properties in printed electronics, comprising: nanoparticle colloid or organic material ink input; a gas supply line for a first gas; a gas supply line for a second gas; a plasma jet printer nozzle comprising an inner tube and optionally one or more outer tubes which may or may not be concentric with the inner tube, in which the inner and outer tubes are made of dielectric material and wherein said inner tube can have a thickness or dielectric constant that is greater than, less than, or the same as the thickness of said one or more outer tubes, and, in the case there is one or more outer tubes, the orifice of said inner tube is inside said outer tube, in which plasma discharge is generated and sustained for tailoring material properties prior to printing, during printing and post printing; a manifold for controlling the gas flow to the plasma jet nozzle; a tube for delivering said ink and said first and second gasses to said plasma jet printer nozzle; a plurality of metal electrodes disposed on the outer tube of the nozzle or on the inner tube or on both the inner and outer tubes extending along the circumference and connected to a high voltage power supply for generating a plasma discharge from said nozzle; wherein the plasma discharge made of reactive and/or non-reactive inert gases from said nozzle has ability to tailor the physical, chemical, optical, magnetic, electronic properties and oxidation state of the bulk of the materials printed through the nozzle, prior to printing while in plasma discharge, during printing and post printing by changing one or more of the features including morphology, oxidation state, chemical bonding, spin state, crystallographic structure, strain, thickness etc.; and wherein the plasma discharge characteristics are controlled by the input gas, applied voltage, nanoparticle concentration and plasma process parameters.

There is further provided according to an embodiment of the invention a device wherein the gas used to create plasma discharge that can tailor the material properties of printed materials may include a non-reactive gas or reactive gas or a combination of reactive and non-reactive gases or a combination of reactive gases.

There is further provided according to an embodiment of the invention a device wherein the non-reactive gas may include one or more of the noble gases helium, neon, argon, krypton, xenon.

There is further provided according to an embodiment of the invention a device wherein the reactive gas may include one or more or any combination of the following: Nitrogen, oxygen, hydrogen, carbon di oxide, acetylene, methane, air, chloride based gases, fluoride based gases, xenon di fluoride, sulphur hexafluoride, carbon tetra fluoride, silane, siloxane, hexamethyldisiloxane, halogen, carbon, boron and sulphur based gases.

There is further provided according to an embodiment of the invention a device wherein the print head nozzle has separate provisions, say a concentric or a non-concentric inner nozzle through which the ink is transported by a certain gas or gas mixture and an outer nozzle that carries a same or different set of gas or gas mixture to enable appropriate reaction of the particles coming out of the inner nozzle with the gas or gas mixture fed through the outer nozzle.

There is further provided according to an embodiment of the invention a device wherein the inner and outer tubes of the print head nozzle has same or different thickness to enable sustaining of plasma in inner and outer region independently and enable materials to get accelerated towards the substrate with or without altering the material properties.

There is further provided according to an embodiment of the invention a device wherein the reactive and non reactive gases can be used i) prior to deposition ii) during deposition and iii) post deposition to create plasma discharge for tailoring material properties.

There is further provided according to an embodiment of the invention a device wherein the materials in the aerosol carried by a non-reactive primary gas through the inner nozzle can be treated in-situ at the outlet of the nozzle using a reactive secondary gas fed through the outer nozzle so that the nano materials undergo surface modification while retaining the bulk properties.

There is further provided according to an embodiment of the invention a device wherein the gas supply through the inner and/or outer nozzle, dielectric constant and thickness of the inner and outer nozzles, distribution of electrodes on the inner and outer walls of the tubes can be appropriately chosen to get high momentum transfer to the aerosol material and also used be used to get highly directional jet to print materials with specific geometries, patterns and properties on 2 dimensional as well as 3 dimensional features.

There is further provided according to an embodiment of the invention a device wherein the reproducibility of materials printing is ensured by reactive plasma jet cleaning of the nozzles by passing reactive gases and generating a plasma at significantly higher potential than the operating potential for printing so that the residues and contaminants formed during deposition are removed.

BRIEF DESCRIPTION OF THE DRAWINGS

FIG. 1A shows the schematic of the plasma jet printer system with provisions for the addition of various process gases to tailor the material properties of the nanoparticle/microparticle in the plasma jet printer. Various process gases including helium, argon, hydrogen, nitrogen, carbon dioxide, oxygen, methane, alkane, alkene, silane, carbon tetra fluoride, sulfur hexafluoride, etc., can be used on their own or with appropriate mixture to suit various requirements.

FIG. 1B shows the schematic of an alternate embodiment of the invention with provisions for the addition of various process gases to tailor the material properties of the nanoparticle/microparticle in the plasma jet printer. Various process gases including helium, argon, hydrogen, nitrogen, carbon dioxide, oxygen, methane, alkane, alkene, silane, carbon tetra fluoride, sulfur hexafluoride, etc., can be used on their own or with appropriate mixture to suit various requirements.

FIG. 2 shows through silicon via (TSV) copper fill using plasma processing. Copper filling by conventional physical vapor deposition copper filling results in void as shown in FIG. 2. Plasma jet printed copper fill has the potential to fill the via without any voids as shown in FIG. 3.

FIG. 3 shows the cross sectional SEM image of copper deposited on a silicon wafer, and the formation of a dense film with varying surface morphology is observed. In situ process for controlling the oxidation state and electronic properties of the deposited materials provides a great advantage over any other printing process currently being used.

FIG. 4 shows an SEM image of copper nanoparticle film deposited using helium plasma. It is evident from the images that the nanoparticles retain their shape and are not undergoing physical deformation.

FIG. 5 shows SEM images of copper nanoparticle film deposited using argon plasma. By varying the deposition time, operating voltage and the gas composition, it is possible to tailor the surface morphology from planar to porous structure. It is evident that the particles undergo physical deformation and form a planar film.

FIG. 6 shows SEM images of copper film deposited using copper nanoparticles by helium-t-nitrogen plasma. The images show that part of the nanoparticles undergo physical deformation and forms a film, while there are significant number of nanoparticles that retain the shape and are embedded in the copper film.

FIG. 7 shows SEM images of porous copper film deposited using copper nanoparticles by helium, nitrogen and hydrogen mixture plasma on aluminum foil.

FIG. 8 shows SEM images of porous copper film deposited using copper nanoparticles by helium, nitrogen and hydrogen mixture plasma on silicon.

FIG. 9 shows SEM images of planar copper film deposited using copper nanoparticles by helium, nitrogen and hydrogen mixture plasma on silicon.

FIG. 10 shows SEM images of plasma printed copper nanoparticles and post treated by plasma to form nanowires.

DETAILED DESCRIPTION OF THE INVENTION

FIG. 1 shows the schematic of the plasma jet printer system with provisions for the addition of various process gases to tailor the material properties of the nanoparticle/microparticle in the plasma jet printer. Various process gases including helium, argon, hydrogen, nitrogen, carbon dioxide, oxygen, methane, alkane, alkene, silane, carbon tetra fluoride, sulfur hexafluoride, etc., can be used on their own or with appropriate mixture to suit the need. Nanoparticle/microparticle colloid input. FIG. 1 shows the following elements:

- Nanoparticle/microparticle colloid input 1
- Gas supply line for in situ processing 2
- Gas supply line for in situ processing 3
- Manifold for controlling the gas flow to the plasma jet nozzle 4
- Plasma jet printer nozzle 5
- Nanoparticle/microparticle colloid 6 in the plasma jet printer nozzle prior to exposure to plasma jet with particle size and shape same as the input colloid
- Nanoparticle/microparticle 7 in the plasma jet with physical, chemical and electronic characteristics controlled by the input gas, applied voltage, nanoparticle/microparticle concentration and plasma process parameters
- Metal electrodes 8 of the plasma jet connected to high voltage power supply for creating the plasma discharge
- Nanoparticle/microparticle 9 exiting the plasma jet nozzle with tailored characteristics determined by the plasma process parameters The plasma jet printer consists of a tube 10 made of any one or more of the following: silicon, silicon wafer, quartz, glass, ceramic, plastic, machinable ceramic, glass reinforced epoxy, polyimide, polyetheretherketone, fluoropolymer, aluminum, or any other dielectric material. The tube also contains two metal electrodes 8 connected to high voltage power supply for creating a plasma discharge in the plasma jet chamber. The high voltage power supply can be any one of the following AC, DC, radio frequency, pulsed power supply. The nozzle 5, through which the material to be deposited is focused to the substrate, can be part of this tube with one end of the tube being the nozzle for printing and another end for receiving the particle to be coated. Alternatively the nozzle, through which the material to be printed is focused to the substrate, can also be a separate component from the tube and connected to the tube to focus the plasma jet. The nozzle could be replaced without having to change the tube and electrode assembly.

Figure 1B:
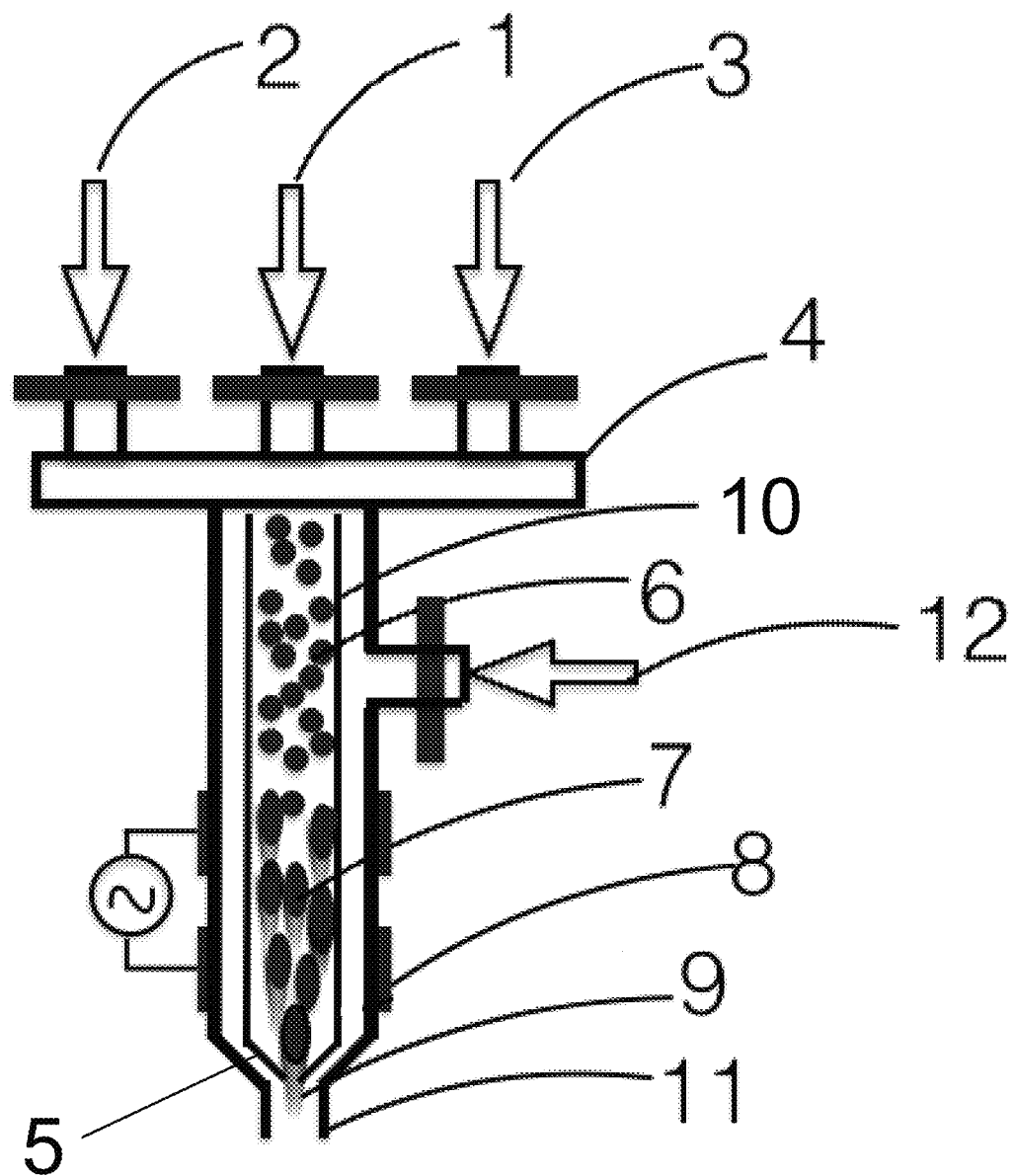

FIG. 1b shows the schematic of the plasma jet printer system with provision 12 to introduce reactive and/or non reactive gases through an outer nozzle 11 with wherein the material in aerosol meets with the gas from outer nozzle at the exit of the inner nozzle. This will enable surface modification of the material while retaining the bulk properties of the nano materials. Also, the secondary gas supply through the outer nozzle 11 can be used for post treatment without having to use an additional plasma jet printer for treatment. The secondary gas supply through the outer nozzle can also be used to sustain the plasma and for focused printing, while the inner nozzle carries the materials to be printed. This can help in increasing the momentum of the particles to get a highly directional printing.

Nonreactive, noble gases like helium, argon etc., can be used to create the discharge as well as for printing. In order to change the chemical characteristics and the electronic properties, any of the reactive gases including nitrogen, oxygen, hydrogen, carbon dioxide, alkane, alkene, carbon tetra fluoride, sulfur hexafluoride etc., can be used. The reactive and non-reactive gases can either be used on their own or with appropriate mixture of gases to obtain the required plasma processing condition.

The material to be coated is either taken as a colloid or as a solution and the colloid/solution is aerosolized and carried by a carrier gas into the plasma jet tube where a plasma discharge is generated. Depending on the nature and type of nanomaterial/micromaterial/solution used, nature and type of coating required, concentration of the material in colloid/ solution, and the nature and type of substrate used the plasma process parameters will be tailored using appropriate gas mixtures, gas flow ratios and electrical energy input for generating the plasma.

In order to change the morphology of the coating/printed material appropriate mixture of gases, gas flow ratios, concentration and electrical energy input are optimized to obtain either non-porous, planar coating with rough/smooth topography or porous coating with controlled pore size.

For example, to plasma print materials with no change in morphology and chemistry of the particles, a helium plasma with a helium flow rate varying from 50 standard cubic centimeter (sccm) to 5000 standard cubic centimeter (sccm), that inherently contains no filamentary discharge and low electron density is used. In order to change the morphology of the particles, argon plasma containing higher electron density than that of helium is used. The argon plasma can contain pure argon flow in the range between 50 sccm to 5000 scam or contain a mixture of helium and argon. To further increase the morphological changes, nitrogen or hydrogen with flow rate varying from 10 sccm to 3000 sccm could be introduced in to the plasma.

The oxidation state of the material to be deposited, electronic structure, magnetic properties, chemical structure, spin state, crystallographic structure, stress, film thickness and electronic conductivity properties can be tailored by appropriate choice of gas mixture and plasma process parameters. For changing the electronic structure, for example to reduce the oxidation state of materials being printed, hydrogen gas with flow rate varying from 10 sccm to 3000 sccm may be introduced in the plasma containing helium or argon or nitrogen or a combination of all these. Oxygen gas or clean dry air with flow rates varying from 10 sccm to 5000 sccm may be introduced for this purpose. This will create reactive oxygen species that will interact with the materials in the plasma or on the surface resulting in oxidation. A combination of oxygen and CF4 may be used to etch the material pre and post-printing. Particle shapes such as spheres, rods, plates, and wires may be used depending on the end use application. For example, wires may be printed to get good electrical conductivity, while rods and plates may be used for optical applications like surface plasmon resonance and plasmonics.

To tune the optical properties including dielectric constant and refractive index of the material, the hydrocarbon content and nitrogen content in the film may be changed by introducing oxygen containing or nitrogen containing gas mixtures. To print low-k dielectric film, for example, silicon dioxide may be printed using silane or siloxane precursor in addition to oxygen or clean dry air gas mixture. To increase the dielectric constant of the film, nitrogen gas may be introduced in addition to silane, or siloxane or amino silane may be used so that the nitrogen incorporation in silicon dioxide increases the dielectric constant of the film.

Among the significant advantages of the present invention is the ability to perform site selective, direct write plasma based printing of conducting materials including conducting organic electronics, reduced graphene oxide, conducting metallic layers, metal oxides, alloys or composites with controlled morphology, oxidation state and electronic structure on flexible substrates, displays, semiconductors, plastics and energy related materials.

Applications that require conducting materials including organics, reduced graphene oxide, metal, metal oxides, alloys or composites previously required to be either printed using multiple techniques with pre and/or post processing or lithography or masking can now be accomplished with direct write plasma jet printing of the present invention. The direct write plasma jet printing allows chemical structure, oxidation state and electronic properties to be tailored in situ during the printing process by appropriate choice of gas and plasma process parameters. For example, to print conducting reduced graphene oxide pattern/film, a graphene oxide colloid may be nebulizer and introduced into the plasma in the presence of helium or argon gas and hydrogen or nitrogen reducing gas. The reducing gas atmosphere will change the non-conducting graphene oxide to conducting reduced graphene oxide. The hydrogen or nitrogen reducing gas flow may vary from 10 sccm to 3000 scam.

For catalyst applications, nanostructured and porous surfaces enhance the activity and selectivity resulting in increased efficiency. Printing of highly porous metal and metal oxide surfaces with ability for high throughput manufacturing is a unique advantage of in situ process control in plasma jet printing.

Figure 2:
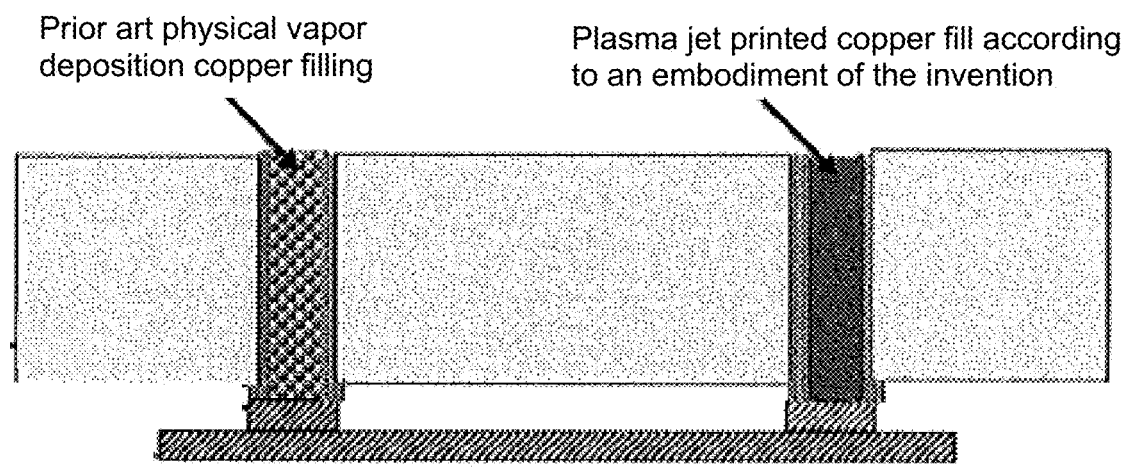

Multi-material printing and alloying capabilities with in situ process control can be used for printing materials with tailored characteristics for bumps in integrated circuit packaging and also in displays. FIG. 2 shows the application of plasma jet printer for copper filling of via in through silicon via semiconductor chips used in high speed processing. The copper filling in through silicon via is traditionally done by seed layer/barrier layer deposition using vacuum based physical vapor deposition followed by electrochemical deposition of copper to fill the via by placing the semiconductor chip in a liquid bath. The electro chemical deposited films are then polished using chemical mechanical polishing to remove the excess deposition. The plasma jet printer may be used to replace the electro chemical deposition and transition of the semiconductor chips from vacuum based physical vapor deposition chamber to liquid bath for copper filling. The copper filling may be done as an in line processing followed by barrier layer deposition using physical vapor deposition without having to go through the liquid bath based deposition. Plasma jet printing process provides a completely dry process that avoids dipping of the semiconductor chips in a liquid electrochemical bath.

Figure 3:
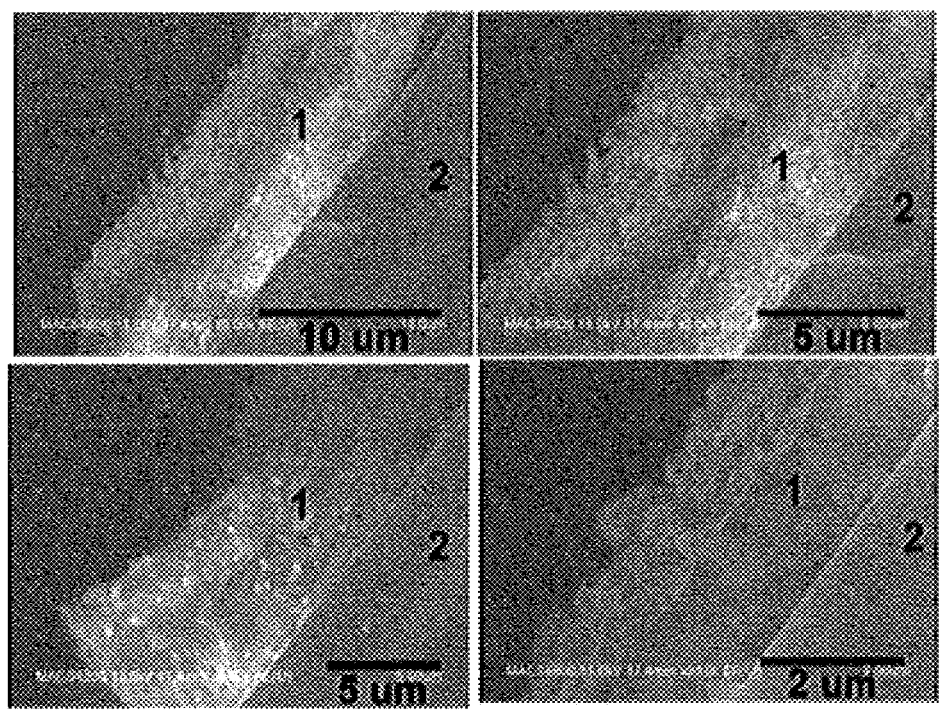

FIG. 3 shows the cross sectional SEM image of copper deposited on a silicon wafer, and the formation of a dense film with varying surface morphology is observed. In situ process for controlling the oxidation state and electronic properties of the deposited materials provides a great advantage over any other printing process currently being used. Table 1. Elemental composition analysis of the plasma jet printed copper film, on silicon substrate, carried out using energy dispersive analysis by x ray spectroscopy (EDS). It is evident from Table 1 that the copper oxide can be reduced to metallic copper in situ by appropriate choice of gas mixtures.

TABLE 1

| Gas mixtures used for plasma printing | Oxidation state of printed copper | Relative conductivity | Copper atomic % | Oxygen atomic % | Carbon atomic % | Silicon atomic % |
|---|---|---|---|---|---|---|
| Helium | $Cu^{2+}$ | Poorly conducting, | 44.85 to 70.54 | 9.42 to 14.76 | 11.13 to 14.81 | 6.61 to 27.45 |
| Helium + Nitrogen-Hydrogen | metallic Copper and $Cu^+$ | Highly conducting | 41.14 to 100 | 0 to 30.3 | 0 to 28.31 | 0 to 1.16 |
| Argon | $Cu^{2+}$ | Poorly conducting | 36.0 to 82.3 | 9.73 to 25.33 | 16.11 to 30.11 | 0 to 28.87 |

The ability to change the composition of the deposited copper film by in situ treatment is shown by plasma jet printing the copper oxide nanoparticles with oxidation states of copper being 2+ and 1+ on silicon using various gases for generating the plasma discharge and by performing elemental quantitative analysis using energy dispersive analysis by x ray spectroscopy EDS. Table 1 shows the elemental analysis for copper film deposited using helium plasma, helium plus nitrogen-hydrogen mixed plasma and argon plasma. It is evident from Table 1 that the carbon and oxygen content in the film can be reduced to 0% and increase the copper content to 100% i.e., pure metallic copper by appropriate use of gas mixtures in printing. Use of nitrogen and hydrogen gas mixture enabled reduction of copper oxide ($Cu^{2+}$ and $Cu^+$) to metallic copper (Cu).

Ability of the plasma printing to change the electronic configuration and oxidation state of materials and transition metals in particular can also be utilized to print/achieve/tailor/magnetic properties as the change in electronic configuration can also be associated with magnetic moment. By demonstrating tailoring the oxidation state of copper by plasma printing, one among the many transition metal oxides, the invention may be extended to other transition metal oxides that include titanium, iron, cobalt, nickel, manganese, zirconium etc., The magnetic transition metal oxides including iron, cobalt, manganese etc., have multiple oxidation states including 2+, 3+ etc., and tailoring the electronic configuration and oxidation state as described above in Table 1 with a suitable gas mixture for each materials have a deep impact on the crystallographic structure, spin state and magnetic properties of these materials.

The plasma discharge characteristics are controlled by the input gas, applied voltage, nanoparticle concentration and plasma process parameters. Electron density of the plasma depends on process conditions, but one prominent feature deciding the electron density of the plasma is the nature of gas used to generate the discharge. The electron densities in argon and helium are different. Argon plasma has higher electron density than the helium plasma for the same process parameters and for atmospheric pressure plasmas the electron density in argon is 2.5 times higher than helium. The thermal conductivity of gases also varies. For example, the thermal conductivity of helium is higher than that of argon and hence the substrate temperature can be changed by using appropriate gas flow of helium and other gas mixtures. When nitrogen is introduced into the helium plasma, the electron density, electron temperature and the current density increases. The substrate temperature may be controlled from 35° C. with pure helium flow to up to 200° C. with addition of hydrogen, while the temperature remaining in between 35° C. to 200° C. with addition of argon or nitrogen. As a result, the energy of the plasma varies depending on the nature and type of gases used to generate the discharge. When the nanoparticle/microparticle colloid enters the plasma, it will be subjected to electrons, ions and radical bombardment from the plasma species. As a result, the momentum the particles carry during collision with the substrate to form a coating varies depends on various factors including the gas flow ratio, nature and type of gases, applied voltage, size and shape of the nozzle, distance between the substrate and plasma jet etc. This will have an impact on both the morphology and chemical structure of the material getting deposited. FIGS. 4, 5, 6, 7, 8 and 9 show copper nanoparticles film, from the same set of copper oxide nanoparticle colloid, printed using atmospheric pressure plasma jet printer using various gas mixtures. These figures show that films with varying pattern, morphology, surface roughness and porosity can be printed using the same set of particles and with appropriate gas mixtures.

For a given gas mixture and electrode design, the film morphology will vary depending on the externally applied voltage to generate the plasma. For example, with an applied voltage of 1 kV the plasma will have lower temperature and electron density, and it might not have impact on the morphology of the particles. However, with an applied potential of 15 kV, the plasma species will have sufficient energy to alter the morphology of the particles. For the same gas mixture, applied voltage and electrode design, the film characteristics will also be dependent on the concentration of the particles in the colloid. For example nano materials with concentration of 1 mg/mL of colloid in a suspension will have a less denser film for given time, gas mixture, applied potential etc., than a colloid with 50 mg/ml.

Figure 4:
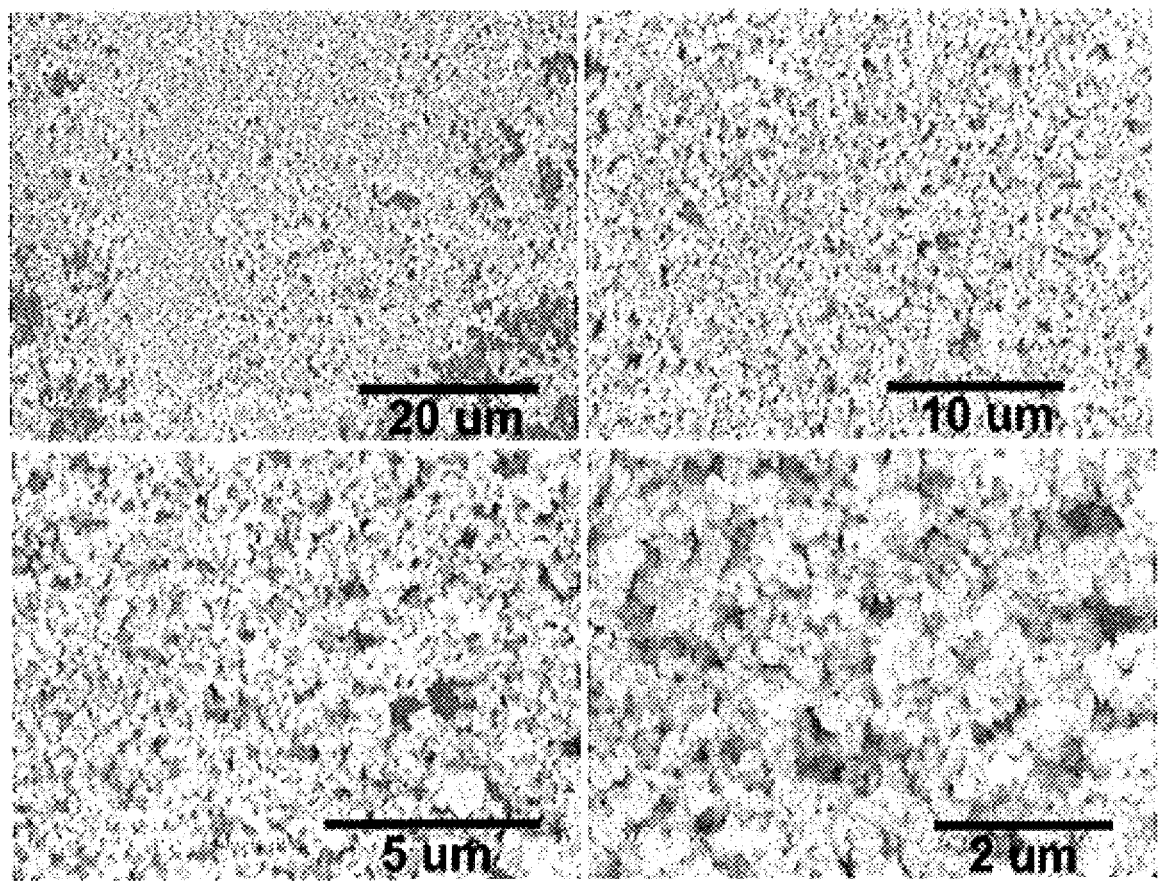
Figure 5:
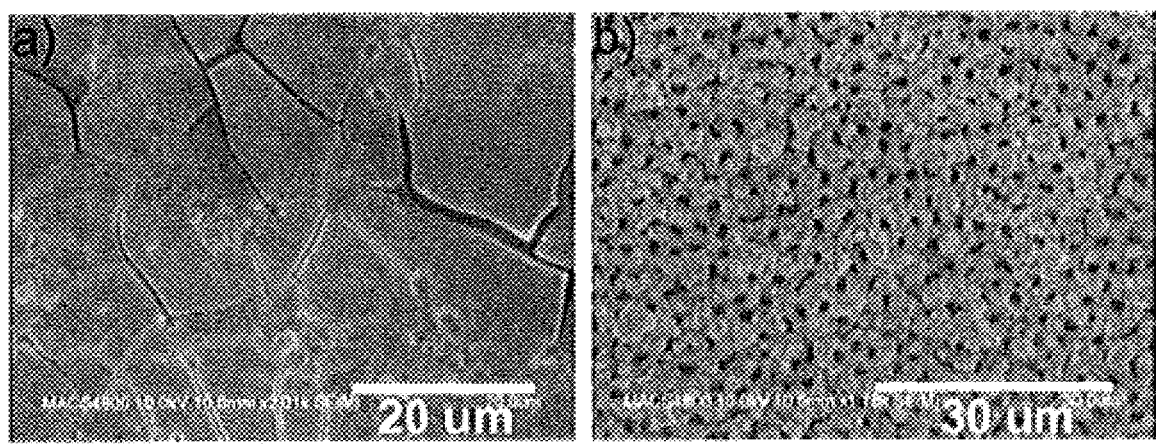

FIG. 4 show SEM image of copper nanoparticle film printed using helium plasma. It can be seen that the nanoparticles retain their shape and are not undergoing any physical deformation to a significant extent. The particles are agglomerated but are mostly spherical similar to the as synthesized nanoparticles. FIG. 5 shows the SEM image of copper nanoparticle film deposited under two different process conditions. As the plasma density, electron density and electron temperature are higher for argon than helium, the nanoparticles undergo physical deformation resulting in uniform film formation as shown in FIG. 5 left. Under certain process conditions complete physical deformation and coalescence is prevented as a result porous structure as shown in FIG. 5 right is obtained.

Figure 6:
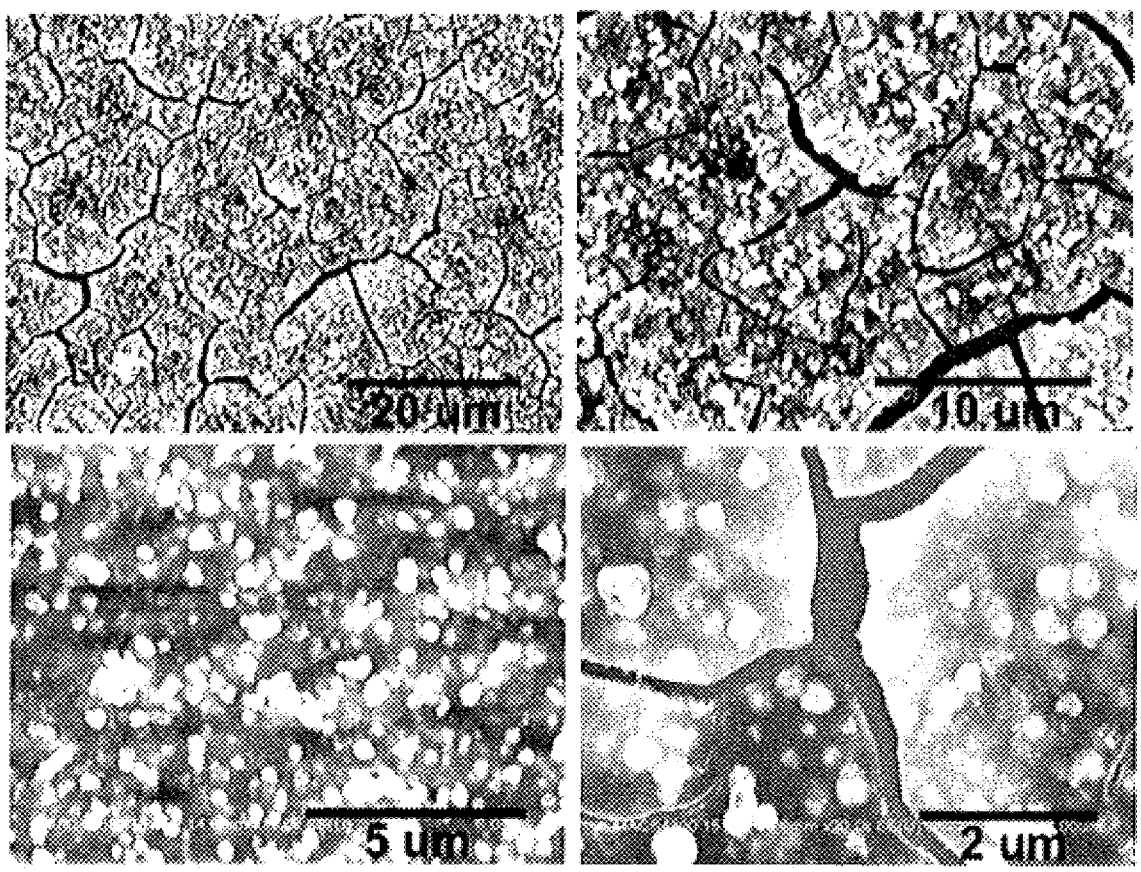

When nitrogen is mixed with the helium plasma, the electron density, electron temperature and the current density varies. As shown in FIG. 6 the particles undergo partial physical deformation resulting in film formation and the nanoparticles retain the shape to a certain extent resulting in film formation with particles embedded on it. By varying the gas ratios, applied voltage and distance between the substrate and electrode, it is possible to increase or decrease the physical deformation resulting in a completely different morphology, stress and thickness.

Figure 7:
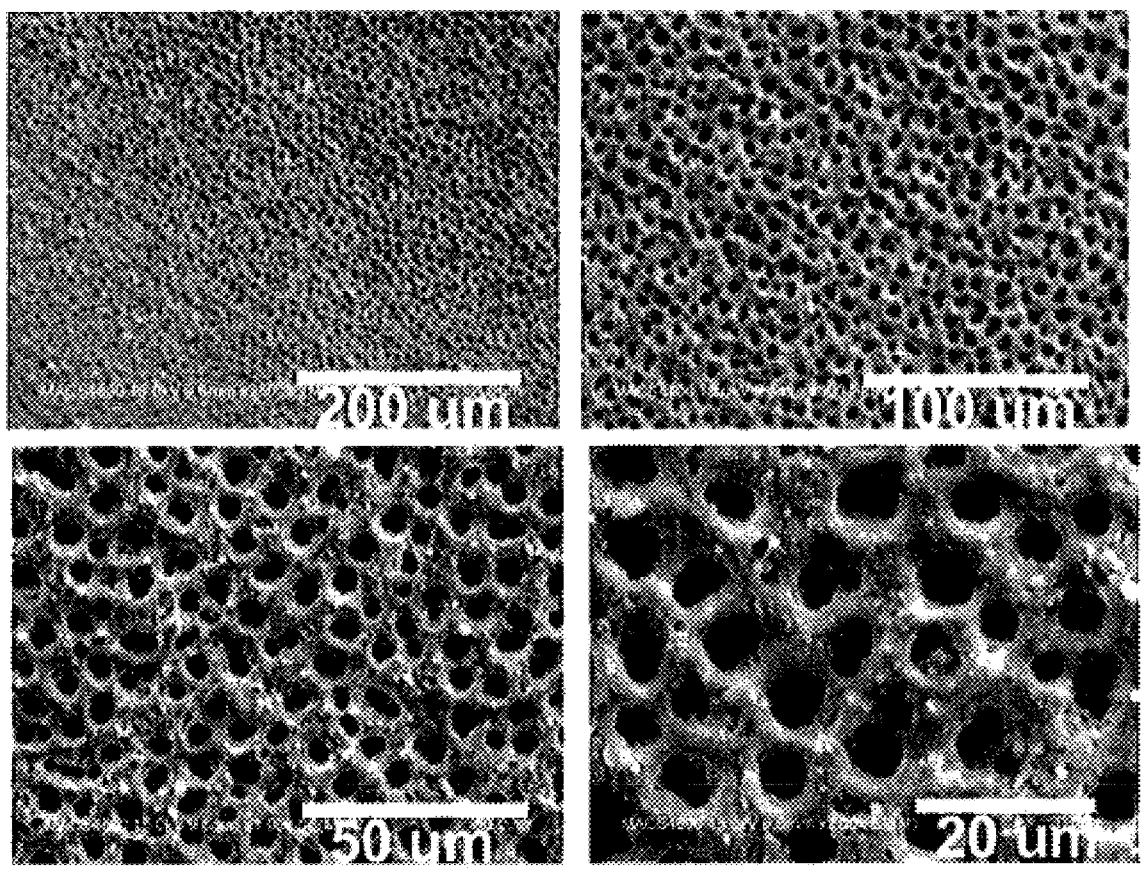
Figure 8:
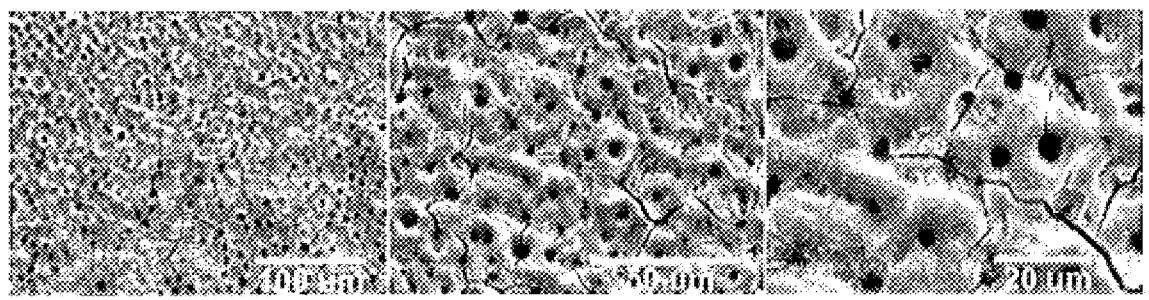
Figure 9:
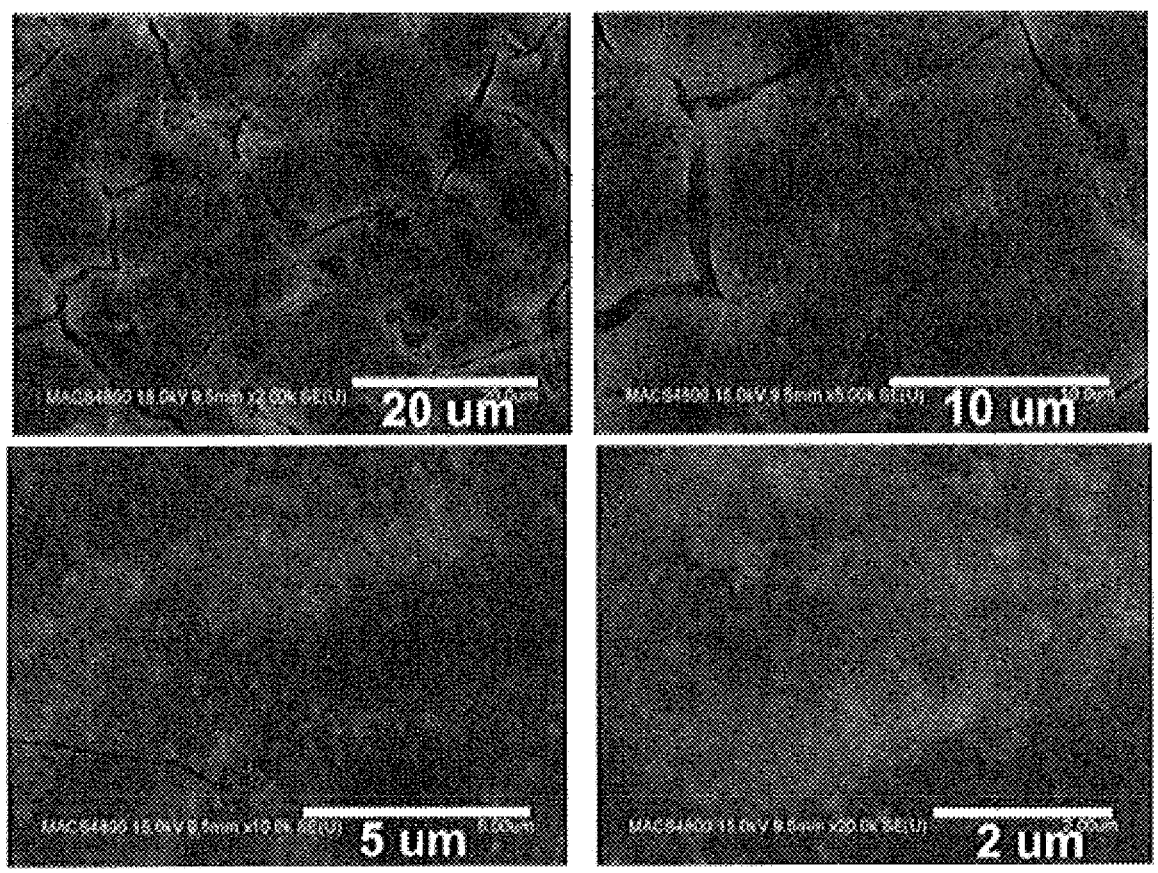

FIGS. 7 and 8 show the copper film deposited on aluminum foil and on silicon wafer respectively using the same set of nanoparticle colloid used with helium, argon, helium 'nitrogen plasmas. In both substrates, it is observed that a highly porous structure is formed. The nanoparticles undergo complete physical deformation and form a film. However, the presence of highly reactive and reducing gases in the plasma viz., nitrogen and hydrogen creates a highly porous structure. It is also evident that a similar porous structure is also observed on both the substrates aluminum and silicon and the process is reproducible. FIG. 9 also shows the formation of a smooth planar copper film using the same set of nanoparticle colloid and the gas mixtures. By carefully controlling the gas mixtures, electron density, plasma density, operating voltage, distance between the electrode and substrate, it is possible to control the physical deformation of the particle and as a result control the morphology, porosity and surface roughness of the film.

Figure 10:
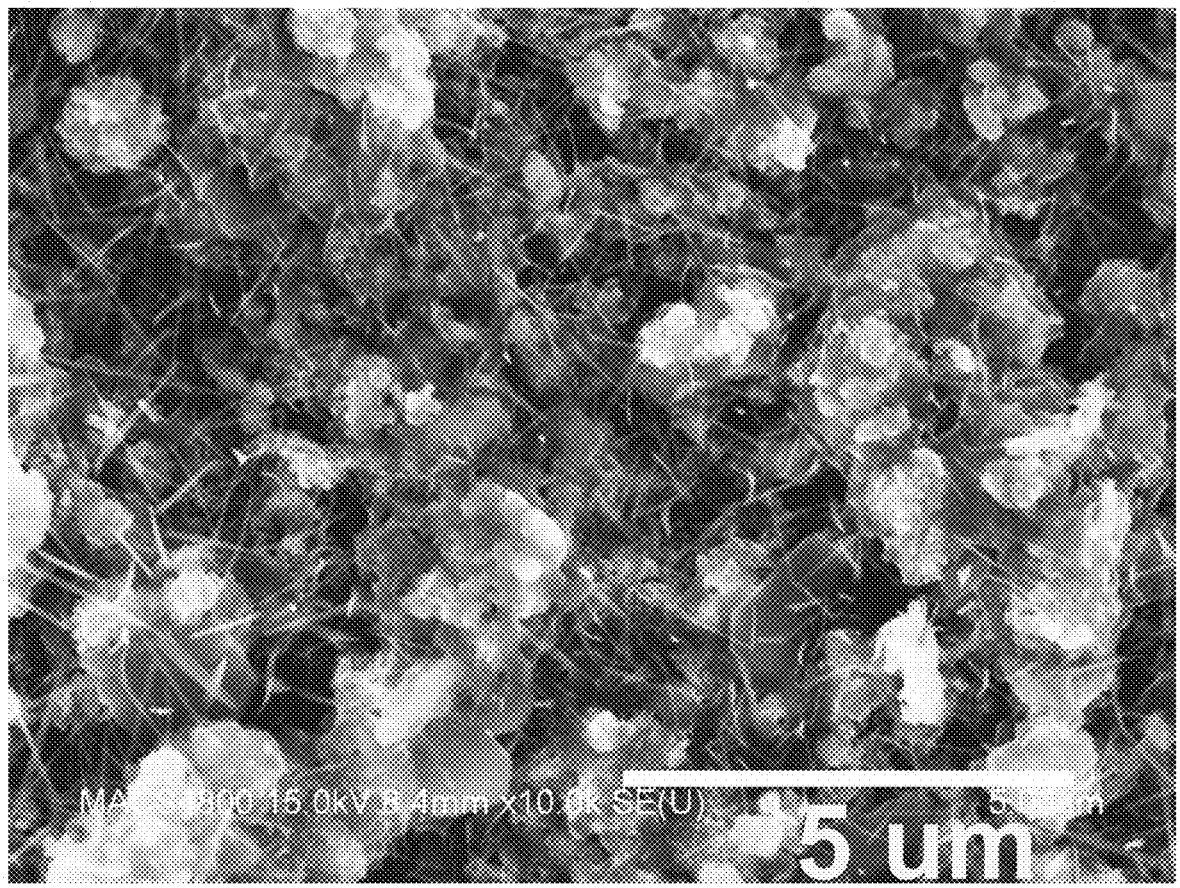

Tailoring the morphology of surface by post-treatment is shown in FIG. 10. Formation of nanowires from copper surface and copper nanoparticles by plasma treatment with inert gas is demonstrated. Presence of hydrogen in the plasma resulted in conducting nanowire as opposed to oxides. FIG. 10 shows the SEM image of plasma printed copper nanoparticle film using argon plasma and post-treated with argon hydrogen. Formation of nanowire and spikes from the nanoparticle surface was observed which resulted in increased physical connectivity of the printed copper by bridging the cracked portions and porous regions. Copper oxide nanowire formation on copper through thermal oxidation has been explored widely. Surface morphology, temperature and treatment time will determine the uniformity of nanowires. Though the thermal oxidation and plasma oxidation results in copper oxide, presence of hydrogen in the plasma treatment resulted in conductive metallic copper.

Plasma jet printing for longer duration results in unwanted and inevitable deposition of materials inside the nozzle and the dielectric tube. This can affect reproducibility and reliability of the plasma jet printer and prevent in-situ tailoring as well as plasma jet printing all together. The deposition of conducting materials inside the nozzle and/or the dielectric tube can severely impact the printer performance. The use of plasma offers a unique advantage by which the unwanted deposition inside dielectric tube and the nozzle can be removed by running the plasma discharge without introducing the materials to be printed into the print head and by having a plain gaseous discharge.

The plain gaseous discharge can be used to remove the materials deposited inside the dielectric tube along the inner circumference and inside the nozzle by one of several ways including ion bombardment, free radical reaction, reactive ion etching etc. The gases mixture can contain inert gases like helium, argon, etc., on their own or a combination of inert gases with reactive gases like hydrogen, oxygen, nitrogen, sulphur hexafluoride, halogen containing gases, etc. A plasma discharge with a combination of higher potential than that used for printing and an appropriate gas mixture as mentioned above, without introducing the materials to be printed can be used to remove the unwanted material deposition inside the print head and for ensuring repeatability and reproducibility.

Having now fully set forth the preferred embodiments and certain modifications of the concept underlying the present invention, various other embodiments as well as certain variations and modifications of the embodiments herein shown and described will obviously occur to those skilled in the art upon becoming familiar with said underlying concept. It should be understood, therefore, that the invention may be practiced otherwise than as specifically set forth herein.

The invention claimed is:

1. An apparatus for printing crystalline metal surface comprising: a ink input in the form of aerosol from a solution containing one or more metal ion with an oxidation state of 1+ or more;
   a gas supply line for one or more gas;
   an inner tube and an outer tube, in which the inner and outer tubes are made of dielectric material, and are of equal length, said inner tube terminating at an inner tapered nozzle, said outer tube terminating at an outer tapered nozzle, and in which a plasma discharge is generated and sustained in both said inner tube and said outer tube;
   the inner tube carrying aerosolized metal ion and the outer tube carrying said one or more gasses;
   one or more metal electrodes disposed along the circumference of the inner tube and connected to a high voltage power supply configured to generate said plasma discharge in both said inner tube and said outer tube;

wherein the plasma discharge is configured to reduce the oxidation state of the metal ion in aerosolized ink to elemental metal and direct the reduced metal towards the substrate in a dry form resulting in printing of conducting crystalline metal surface on a substrate.

2. An apparatus according to claim 1, wherein the gas comprises a non-reactive gas, a reactive gas, or a combination thereof.

3. An apparatus as recited in claim 2, wherein the gas comprises a non-reactive gas selected from a group consisting of helium, neon, argon, krypton, and xenon and/or reactive gas selected from a group consisting of hydrogen, nitrogen, acetylene, methane, ammonia, and a combination thereof.

4. An apparatus as recited in claim 1, wherein the inner and outer tubes of the print head nozzle has same or different thickness.

5. An apparatus as recited in claim 2, wherein the reactive and non reactive gases can be used i) prior to deposition ii) during deposition and iii) post deposition to create plasma discharge for tailoring material properties.

6. An apparatus as recited in claim 1, wherein one or more gas, dielectric constant and thickness of the inner and outer tubes, and distribution of electrodes can be appropriately chosen to get high momentum transfer to the material and also used to get highly directional jet to print materials with specific geometries, patterns and properties on 2 dimensional as well as 3 dimensional features.

7. An apparatus as recited in claim 1, wherein the metal comprises a transition metal.

8. An apparatus as recited in claim 1, wherein said gases used to generate the plasma and create a reducing environment are selected from the group consisting of helium, argon, hydrogen, nitrogen, or any hydrogen-containing reducing compounds.

9. An apparatus as recited in claim 1, wherein said gas used to generate the plasma is made to flow at a rate of from 10 sccm to 5000 sccm.

10. An apparatus as recited in claim 1, wherein the plasma is generated at atmospheric pressure and the temperature on the substrate falls in a range of 35 deg C. to 200 deg C.

11. An apparatus as recited in claim 1, wherein the three-dimensional conducting structure of metal is printed and grown with specific geometries in two and three dimensions.

12. An apparatus as recited in claim 1, further comprising printing and post treating the printed material to further reduce the oxidation state of the material and form crystalline structure.

13. A method of printing crystalline metal on a substrate, the method comprising:

(a) introducing a material comprising metal ion with a oxidation state of 1+ or more into said inner dielectric tube of said apparatus of claim 1;
(b) exposing said material comprising metal ion to atmospheric pressure plasma generated by said electrodes of said apparatus of claim 1, thereby reducing the oxidation state of the material to form elemental metal;
(c) directing the reduced elemental metal towards a substrate to print conducting crystalline metal onto said substrate.

14. The method of claim 13, wherein said plasma can be treated on printed metal to further change the morphology, oxidation state, chemical bonding, spin state, crystallographic structure, strain, thickness, or a combination thereof.

15. The method of claim 13, wherein the said metal upon printing on the surface is crystalline and conducting in nature.

* * * * *